(12) United States Patent
Tomishima et al.

(10) Patent No.: US 6,470,467 B2
(45) Date of Patent: *Oct. 22, 2002

(54) SYNCHRONOUS SEMICONDUCTOR MEMORY DEVICE CAPABLE OF PERFORMING OPERATION TEST AT HIGH SPEED WHILE REDUCING BURDEN ON TESTER

(75) Inventors: Shigeki Tomishima; Tsukasa Ooishi, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/349,260

(22) Filed: Jul. 8, 1999

(65) Prior Publication Data

US 2002/0049946 A1 Apr. 25, 2002

(30) Foreign Application Priority Data

Jan. 12, 1999 (JP) .............................. 11-005656

(51) Int. Cl.⁷ .......................... G06F 11/00; G01R 31/28
(52) U.S. Cl. ....................... 714/744; 365/233
(58) Field of Search ............... 714/731, 744; 365/233, 230.08

(56) References Cited

U.S. PATENT DOCUMENTS

| | | | | |
|---|---|---|---|---|
| 5,511,029 A | | 4/1996 | Sawada et al. ............. 365/201 |
| 5,812,490 A | * | 9/1998 | Tsukude ..................... 365/233 |
| 5,815,462 A | * | 9/1998 | Konishi et al. ............. 365/233 |
| 5,844,859 A | * | 12/1998 | Iwamoto et al. ............ 365/233 |
| 5,867,447 A | * | 2/1999 | Koshikawa ................ 365/233 |
| 6,055,194 A | * | 4/2000 | Seo et al. ................... 365/194 |
| 6,151,271 A | * | 11/2000 | Lee ............................. 365/223 |
| 6,243,320 B1 | * | 6/2001 | Hamamoto et al. .... 365/230.08 |

FOREIGN PATENT DOCUMENTS

| | | |
|---|---|---|
| JP | 6-187797 | 7/1994 |
| JP | 10-064298 | 3/1998 |

* cited by examiner

*Primary Examiner*—Albert Decady
*Assistant Examiner*—Shelly A Chase
(74) *Attorney, Agent, or Firm*—McDermott, Will & Emery

(57) ABSTRACT

A driver circuit applies a write data whose level is inverted for every write cycle to a selected memory cell in accordance with a write data held by a latch circuit when a writing operation in a test operation mode is designated in the test operation mode. A read driver circuit applies a comparison result of sequentially read data to a latch circuit in accordance with a read clock signal in the test operation mode. Data input and output buffers operate in synchronization with an external clock signal.

13 Claims, 14 Drawing Sheets

SYNCHRONOUS SEMICONDUCTOR MEMORY DEVICE CAPABLE OF PERFORMING OPERATION TEST AT HIGH SPEED WHILE REDUCING BURDEN ON TESTER

BACKGROUND OF THE INVENTION

1. Field of the Invention

The present invention relates to semiconductor memory devices and, more particularly, to a synchronous semiconductor memory device operating in synchronization with an external clock signal.

2. Description of the Background Art

As an operation speed of the recent microprocessor (hereinafter abbreviated as an MPU) has been increased, to achieve rapid access by a Dynamic Random Access Memory (hereinafter abbreviated as a DRAM) or the like which is used as a main memory device, a synchronous DRAM (hereinafter abbreviated as an SDRAM) or the like which operates in synchronization with a clock signal is used.

In such SDRAM, a bank structure in which a memory cell array is divided into mutually independent banks is used to enable an operation at higher speed. More specifically, the operation is divided into row related and column relation operations which are independently controlled for every bank and, for example, these banks perform an interleave operation to reduce a precharge time or the like, so that a high speed operation is achieved.

For the above mentioned SDRAM, however, in order to further increase the speed of the operation, a so-called double data rate SDRAM (hereinafter abbreviated as a DDR-SDRAM) is achieved. In the DDR-SDRAM, data is not only output at an activation edge (which is for example a transition edge from "L" to "H" level) of an external clock signal, but also input/output in synchronization with an inactivation edge (which is for example a transition edge from "H" to "L" level). On the other hand, a conventional SDRAM in which data is input/output only in synchronization with the activation edge of the external clock signal is called a single data rate SDRAM (hereinafter abbreviated as an SDR-SDRAM).

As the operation speed of the semiconductor memory device such as the SDRAM increases as described above, there arises the following problem in the operation test during a manufacturing process or before shipping products.

More specifically, a very expensive tester device is required as the increase in the operation speed of the semiconductor memory device means that the operation speed of the tester device therefor must also be increased. This results in increase in a test cost. In other words, the manufacturing cost of the product disadvantageously increases.

SUMMARY OF THE INVENTION

An object of the present invention is to provide a synchronous semiconductor memory device capable of inexpensively performing an operation test while reducing the burden on a tester even in the case of the synchronous semiconductor memory device capable of operating at a high speed.

In short, the present invention is a synchronous semiconductor memory device which receives an address signal and a control signal in synchronization with an external clock signal and includes a memory cell array, internal synchronization signal generating circuit, address signal input circuit, address counter circuit, memory cell selecting circuit and data writing circuit.

The memory cell array includes a plurality of memory cells arranged in a matrix. The internal synchronization signal generating circuit outputs a first internal clock signal in synchronization with the external clock signal in response to designation of a first operation mode, and outputs a second internal clock signal in synchronization with the external clock signal and having a frequency which is higher than that of the external clock signal in response to designation of a second operation mode.

The address signal input circuit receives the address signal in synchronization with the external clock signal. The address counter circuit generates internal address signals corresponding to the adjacent memory cells in accordance with the address signal over a prescribed number of cycles of an output from the internal synchronization signal generating circuit in time series.

The memory cell selecting circuit operates in accordance with the output from the internal synchronization signal generating circuit for selecting a memory cell in accordance with the internal address signal. The data writing circuit outputs a write data to the memory cell which has been selected by the memory cell selecting circuit.

The data writing circuit includes: an internal data generating circuit generating an internal write data which is sequentially inverted in synchronization with the second internal clock signal in accordance with a prescribed write data in the second operation mode; and a driving circuit outputting an output from the internal data generating circuit to the memory cell which is sequentially selected by the memory cell selecting circuit in the second operation mode.

According to another aspect of the present invention, a synchronous semiconductor memory device is provided which receives an address signal and a control signal in synchronization with an external clock signal and includes a memory cell array, internal synchronization signal generating circuit, address signal input circuit, address counter circuit, memory cell selecting circuit and data reading circuit.

The memory cell array includes a plurality of memory cells arranged in a matrix. The internal synchronization signal generating circuit outputs a first internal clock signal in synchronization with the external clock signal in response to designation of a first operation mode, and outputs a second internal clock signal in synchronization with the external clock signal and having a frequency which is higher than that of the external clock signal in response to designation of a second operation mode.

The address signal input circuit receives the address signal in synchronization with the external clock signal. The address counter circuit sequentially generates internal address signals by the number corresponding to a burst length in accordance with the address signal for every cycle of an output from the internal synchronization signal generating circuit.

The memory cell selecting circuit operates in accordance with the output from the internal synchronization signal generating circuit for selecting a memory cell in accordance with the internal address signal. The data reading circuit reads a data from the memory cell which has been selected by the memory cell selecting circuit.

The data reading circuit includes: a comparing circuit comparing a data which is sequentially read corresponding to the burst length and an expected value; and a count circuit counting a value of an internal address until the comparing circuit outputs a comparison result indicating mismatch.

Therefore, a main advantage of the present invention is that the burden on the tester can be reduced as the internal circuit operates at a speed which is higher than that of the external clock signal and internally generates and writes data which have been inverted between the adjacent memory cells in the second operation mode.

Another advantage of the present invention is that the internal circuit operates at a speed which is higher than that of the external clock signal, and that it is possible to detect an address to be burst read at which a defective bit is caused.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a schematic block diagram shown in conjunction with a structure of a data input buffer 1072a.

DESCRIPTION OF THE PREFERRED EMBODIMENTS

First Embodiment

Figure 1:
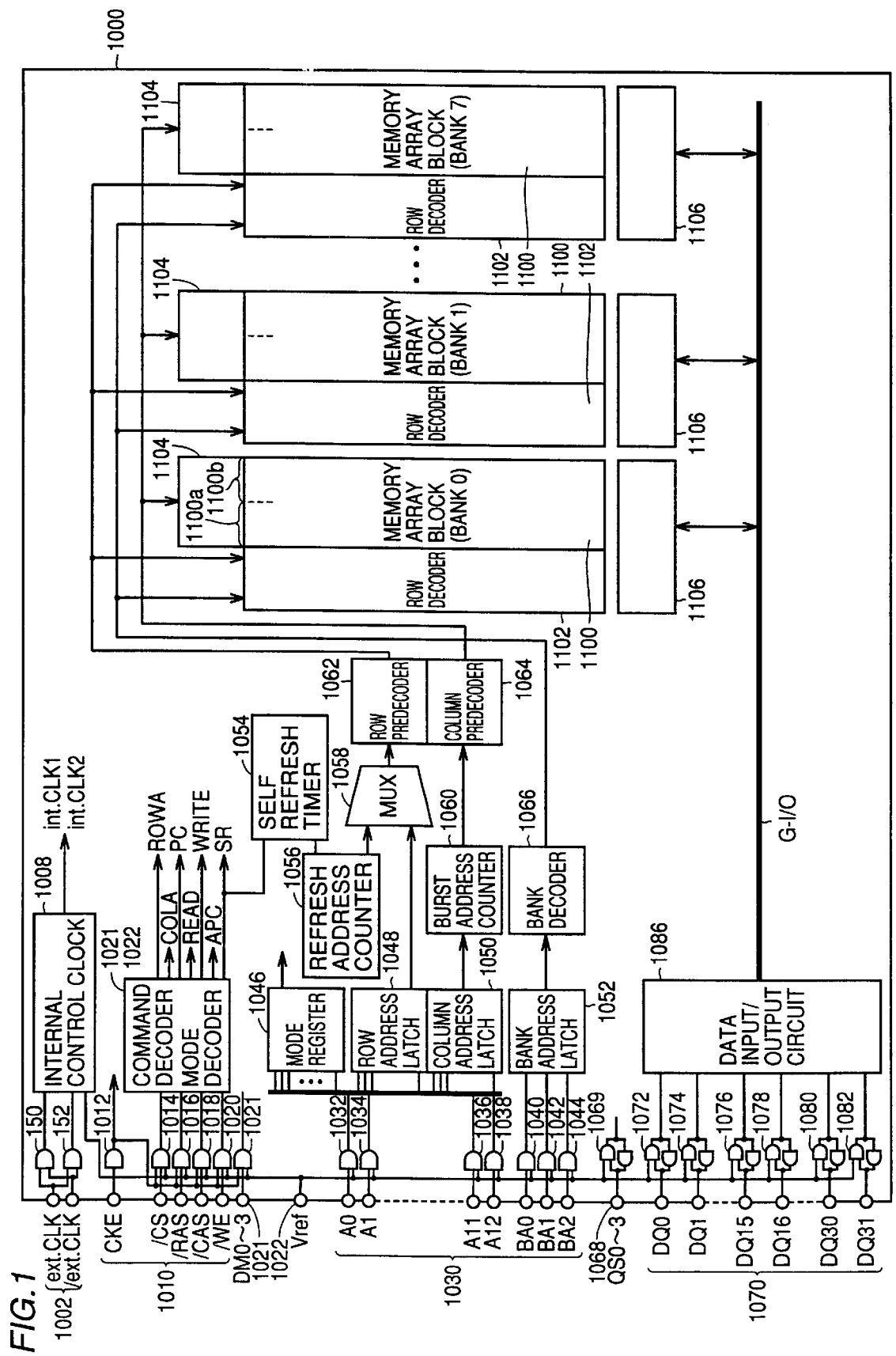
FIG. 1 is a schematic block diagram showing a structure of an SDRAM 1000 according to a first embodiment of the present invention.

An SDRAM 1000 includes: an external clock signal input terminal 1002 receiving complementary clock signals ext-.CLK and ext./CLK which are externally applied; clock input buffers 150 and 152 buffering the clock signal which has been applied to external clock terminal 1002; an internal control clock signal generating circuit 1008 receiving outputs from clock buffers 150 and 152 for generating first and second internal clock signals int.CLK1 and int.CLK2; and command and mode decoders 1021 and 1022 receiving an external control signal applied to an external control signal input terminal 1010 through input buffers 1012 to 1020 which operate in synchronization with external clock signal ext.CLK.

Applied to internal control signal input terminal 1010 are a signal CKE, chip select signal /CS, row address strobe signal /RAS, column address strobe signal /CAS, write control signal /WE and data mask signals DM0 to DM3.

Signal CKE instructs to enable input of a control signal to a chip and, if the signal is not activated, the input of the control signal is not enabled and the chip does not operate.

Signal /CS determines if a command signal has been input and, at the rising edge of the clock signal when the signal is in an activation state (at an "L" level), a command is identified in accordance with a combination of levels of other control signals.

Signal /RAS instructs an operation of a row related circuit, and signal /CAS instructs activation of an operation of a column related circuit. Signal /WE identifies a writing or reading operation.

Signals DM0 to DM3 instruct mask operations for inputting/outputting data with respect to corresponding data input/output terminals DQ0 to DQ7, DQ8 to DQ15, DQ16 to DQ23 and DQ24 to DQ31, respectively.

A command decoder 1021 outputs an internal control signal for controlling an operation of an internal circuit of SDRAM 1000 in accordance with the external control signals. Mode decoder 1022 outputs signals ROWA, COLA, ACT, PC, READ, WRITE, APC and SR as internal control signals, for example. Signals ROWA and COLA respectively indicate that row and column related accesses are performed, and signal ACT instructs activation of a word line.

Signal PC instructs a precharge operation and also instructs to end the operation of the row related circuit. Signals READ and WRITE respectively instruct reading and writing operations for the column related circuit.

Signal APC instructs an auto precharge operation and, when the auto precharge operation is designated, the precharge operation is automatically started upon end of a burst cycle. Signal SR instruct a self refresh operation. As soon as the self refresh operation is started, a self refresh timer operates and, when a prescribed period of time is elapsed, it activates the word line for starting a refresh operation.

As will later be described, mode decoder 1022 for example detects the test mode operation has been designated by a combination of the external control signals.

SDRAM 1000 further includes: a self refresh timer 1054 which begins to operate when a self refresh mode is designated by signal SR and activates the word line, or instructs to start the refresh operation when a prescribed period of time is elapsed; and a refresh counter 1056 generating an address for performing the refresh operation in accordance with an instruction from self refresh timer 1054.

SDRAM 1000 further includes: a reference potential input terminal 1022 receiving a signal VREF which is used as a reference for determining if an input signal is at an "H" or "L" level; a mode register 1046 holding information on a prescribed operation mode, that is, for example, information on a data for a burst length or which of single and double data rate operations has been designated in accordance with a combination of an address signal applied through an address signal input terminal 1030 and the above mentioned external control signal; a row address latch 1048 receiving address signals through address signal input buffers 1032 to 1038 operating in synchronization with external clock signal ext.CLK and holding input row addresses at a timing at which the row address is input; a column address latch 1050 receiving address signals A0 to A12 and holding the column addresses at a timing at which the column address is input; a multiplexer 1058 receiving outputs from refresh address counter 1056 and row address latch 1048 for selecting and outputting outputs from row address latch 1048 and refresh address counter 1056 in normal and self refresh operations, respectively; a row predecoder 1062 receiving an output from multiplexer 1058 for predecoding the row address; a burst address counter 1060 generating an internal column address in accordance with the data of the burst length from mode register 1046 using the column address which is held in column address latch 1050 as a reference; a column predecoder 1064 receiving an output from burst address counter 1060 for predecoding the corresponding column address; a bank address latch 1052 receiving bank addresses BA0 to BA2 applied to the address input terminal through input buffers 1040 to 1044 operating in synchronization with external clock signal ext.CLK and holding a designated bank address value; and a bank decoder 1066 receiving an output from bank address latch 1052 for decoding the bank address.

It is noted that the address signal applied to address signal input terminal 1030 is also used for writing data in the mode register in accordance with a combination of several bits thereof when writing operation mode information to the mode register. For example, setting of values of a burst length BL, CAS latency CL or the like is designated in accordance with a combination of a prescribed number of bits of the address signal.

Bank address signals BA0 to BA2 instruct to access banks during row and column related accesses. In other words, bank address signals BLA0 to BLA2 applied to address signal input terminal 1030 are received by bank address latch 1052, decoded by bank decoder 1066 and transmitted to each of the memory array blocks (banks) during each of row and column related accesses.

SDRAM 1000 further includes: memory array blocks 1100, 1110 and 1120 operating as banks 0 to 7 each capable of independently performing a reading/writing operation; a row decoder 1102 selecting a row (a word line) in a corresponding bank in accordance with outputs from bank decoder 1066 and row predecoder 1062; a column decoder 1104 selecting a column (a bit line pair) in the corresponding bank in accordance with an output from column predecoder 1064; an I/O port 1106, applying a data which is read from the selected memory cell in the selected bank to a global I/O bus G-I/O in the reading operation and applying a write data transmitted by bus G-I/O to the corresponding bank in the writing operation; a data input/output circuit 1086 holding the externally applied write data and applying it to bus G-I/O in the writing operation and holding the read data transmitted by bus G-I/O in the writing operation; and bidirectional input/output buffers 1072 to 1082 inputting/outputting input/output data DQ0 to DQ31 between data input/output circuit 1086 and data input/output terminal 1070.

Signals QS0 to QS3 which are input/output with respect to input/output terminal 1068 through bidirectional input/output buffer 1069 are data strobe signals indicating a timing at which data are input/output with respect to data input/output terminals DQ0 to DQ7, DQ8 to DQ15, DQ16 to DQ23 and DQ24 to DQ31, respectively. Signals QS0 to QS3 are hereinafter generally called signal QS.

Figure 2:
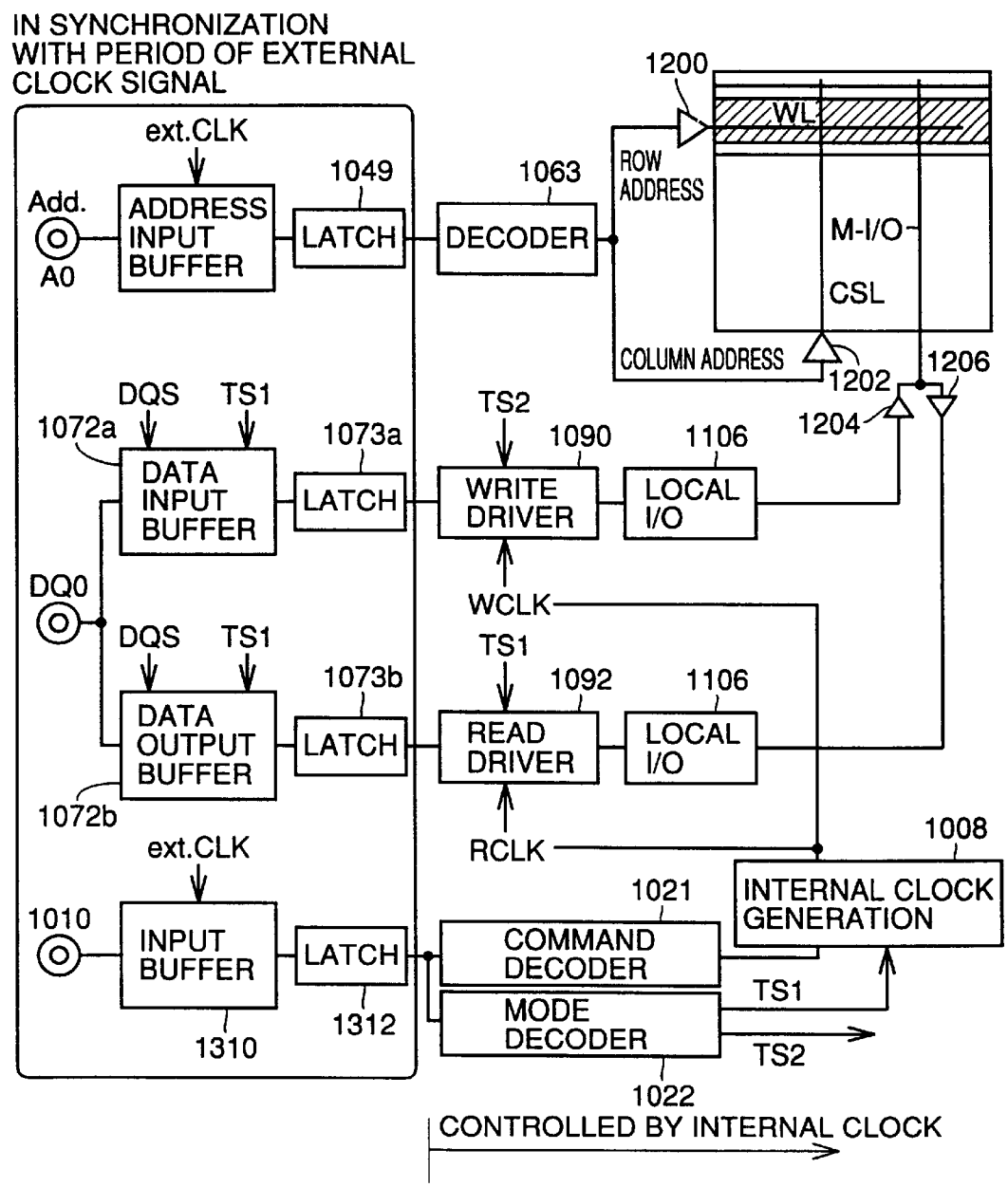
FIG. 2 is a schematic diagram showing a structure of a data input/output portion of SDRAM 1000.

FIG. 2 is a schematic block diagram showing a part of the structure of SDRAM 1000 shown in FIG. 1 which is related to the data input/output operation.

Shown in FIG. 2 are only portions corresponding to the address signal input terminal to which a least significant bit A0 of the address signal is applied of the address signal input terminals, the data input/output terminal inputting/outputting data DQ0 of the data input/output terminals, and the control signal input terminal receiving the mode command designating the operation mode of control signal input terminal 1010.

Referring to FIG. 2, address signal A0 applied to address signal input terminal 1030 is held in a latch circuit 1049 (a row address latch 1048 and a column address latch 1050 are generally called latch 1049) through an address input buffer 1032 operating in synchronization with external clock signal ext.CLK.

The address signal held in latch circuit 1049 is decoded by a decoder 1063 (row predecoder 1062 and row decoder 1102 or column predecoder 1064 and column decoder 1140 are generally called decoder 1063) operating in synchronization with internal clock signal int.CLK. A word line driver 1200 in row decoder 1102 selectively activates a corresponding word line WL in accordance with the decoded internal row address signal. On the other hand, a driver 1202 in column decoder 1104 selectively activates a column selection line CSL in accordance with the decoded internal column address signal.

The row and column address signals are time divisionally applied to SDRAM 1000 as in the case of a general SDRAM.

The control signal which is applied through control signal input terminal 1010 (which corresponds to the control signal input terminals receiving the command indicating the reading/writing operation or the like and a mode signal indicating the operation mode) is received by input buffer 1310 (which generally correspond to input buffers 1012 to 1020 shown in FIG. 1) operating in synchronization with external clock signal ext.CLK and held by latch circuit 1312.

A command data which is held by latch circuit 1312 is decoded by command decoder 1021 and, determination is made as to if the reading or writing operation has been designated or the like.

Mode decoder 1022 determines the designated test mode in accordance with the data held by latch circuit 1312 and, as will later be described, selectively activates first test signals TS1, TS2 and TS3.

Here, command and mode decoders 1021 and 1022 also operate in synchronization with internal clock signal int.CLK2.

An internal control clock generating circuit 1008 outputs read and write clock signals RCLK and WCLK in the reading and writing operations in accordance with an instruction from command decoder 1021, respectively.

Further, internal control clock generating circuit 1008 receives first test signal TS1 from mode decoder 1022 for outputting a clock signal having the same frequency as and in synchronization with the external clock signal when signal TS1 is inactivated as internal clock signal int.CLK1 and for generating internal clock signal int.CLK2 having a frequency which is integral multiples of (for example a frequency which is four times higher than) that of external clock signal ext.CLK as will later be described when signal TS1 is in an active state.

The data applied to data input/output terminal 1070 is received by data input buffer 1072 in synchronization with data strobe signal QS and held by latch circuit 1073*a*. The data held by latch circuit 1073*a* is applied to global I/O bus G-I/O by a driver circuit 1090 operating in accordance with write clock signal WCLK. The write data transmitted by the global I/O line pair G-I/O, is selectively applied to the bank which has been selected by an I/O circuit 1106 provided corresponding to each bank. The write data is applied to a main I/O line pair M-I/O for the selected bank from I/O circuit 1106 through drive circuit 1204. The write data is written to a memory cell which has been selected by word line WL and column selection line CSL.

As will later be described, driver circuit 1090 outputs the data held by latch circuit 1073a while alternately inverting it in every write cycle when second test signal TS2 is in the active state.

In the data reading operation, the read data from a memory cell which has been selected by word line WL and column selection line CSL is transmitted through main I/O line pair M-I/O, amplified by driver circuit 1206 and, subsequently, applied to global I/O bus G-I/O through I/O circuit 1106.

The data which has been transmitted through the global I/O bus is applied to a latch circuit 1073b in synchronization with read clock signal RCLK by driver circuit 1092, and the data held by latch circuit 1073b is applied to data input/output terminal DQ0 through data output buffer 1072b.

As will later be described, driver circuit 1092 applies a test result of the data which has been read from the memory array to latch circuit 1073b in a period when first test signal TS1 is inactive (that is a period when signal TS1 is active (at the "H" level) and the test mode is designated) unlike the case of the normal operation mode in which driver circuit 1092 directly transmits the read data to latch circuit 1073.

Data output buffer 1073b performs a data output operation in synchronization with data strobe signal QS with generated by SDRAM 1000 when signal TS1 is inactive (during normal operation). On the other hand, when signal TS1 is active (at the "H" level), the timing for outputting data is in synchronization with the external clock signal.

Operation of DDR-SDRAM in Normal Operation Mode

Figure 3:
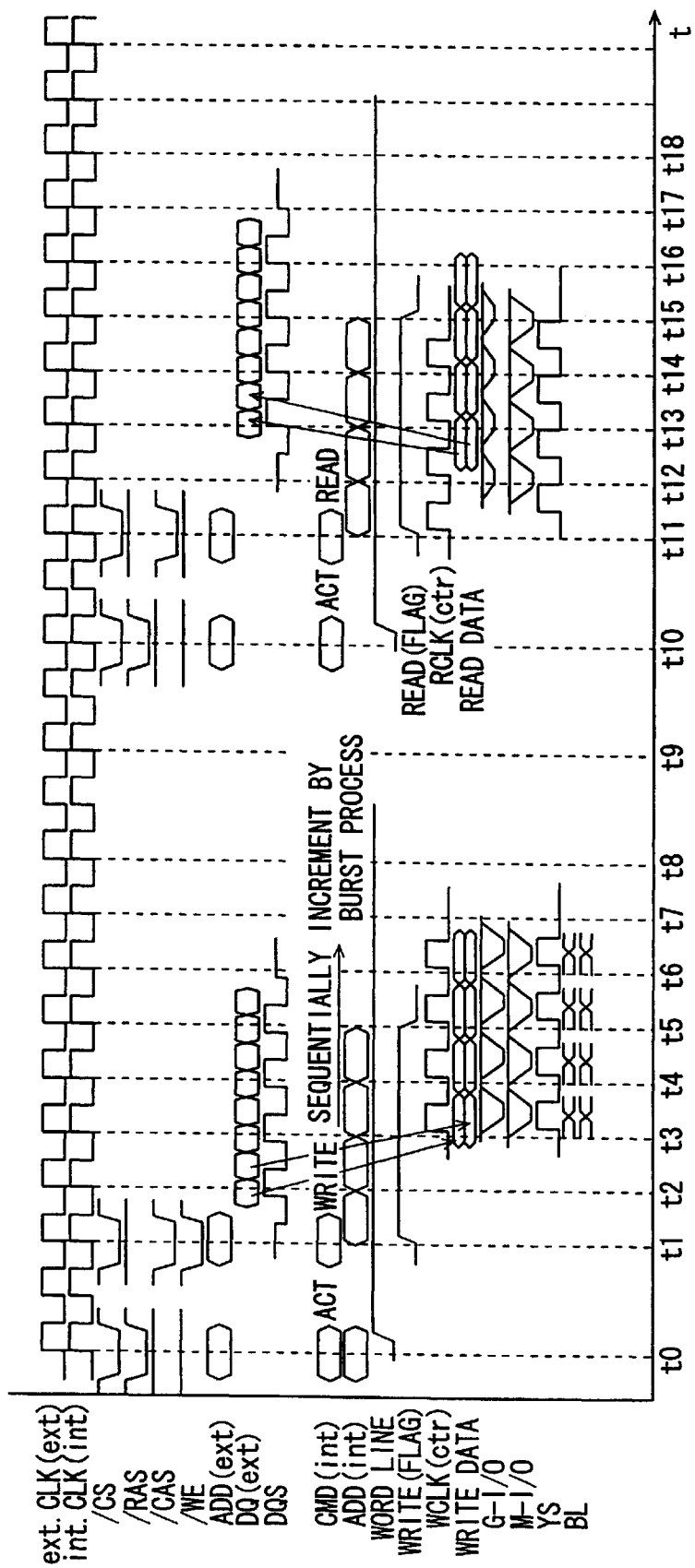
FIG. 3 is a timing chart shown in conjunction with a normal operation of SDRAM 1000.

FIG. 3 is a timing chart schematically showing a double data rate operation of SDRAM 1000 shown in FIG. 1.

Referring to FIG. 3, an operation when a burst length is 8 and a CAS latency for the reading operation is 2 will be described.

Here, the burst length is 8 and the CAS latency for reading is 2. The CAS latency of 2 means that outputting of data is started from the second clock after a command is input.

Writing Operation In DDR-SDRAM Mode

Referring to FIG. 3, at the rising edge of external clock signal ext.CLK at a time t0, activation of the SDRAM is instructed in accordance with the fact that signals /CS and /RAS are in the active state.

At t0, row and bank addresses are received and held by row and bank address latches 1048 and 1052.

Thereafter, the writing operation is designated in accordance with the fact that signals /CS, /CAS and /WE are active at the activation edge of internal clock signal int.CLK at a time t1. The column address is also input and a value thereof is held by column address latch 1050. At the time, by setting the operation mode for burst write, the writing operation in the next and following cycles is performed by a burst test counter 1060 while automatically incrementing the column address in SDRAM 1000.

The designation of the writing operation allows signal WRITE of a flag signal for instructing the internal writing operation to be brought into the active state.

Subsequently, the write data is received by externally changing the write data in synchronization with signal QS applied to SDRAM 1000.

Further, the serially written data are converted to parallel data by every 2 bits in data input/output circuit 1086 and, written to the selected memory cell at a time t3 and t4 to t6.

Reading Operation in DDR-SDRAM Mode

In the reading operation, at a time t10, an ACT command for activating the word line is input in accordance with the fact that signals /CS and RAS are in the active state at the rising edge of external clock signal ext.CLK. At this point, the address designating the word line is simultaneously input.

Thereafter, at a time t11, the reading operation is designated in accordance with the fact that signals /CS and /CAS are in the active state. At the time, the column address is designated and held by column address latch 1050. Burst address counter 1060 generates an internal address in accordance with the column address held by column address latch 1050. The word line is activated and the data which has been read in parallel from the selected memory cell by 2 bits and amplified by the sense amplifier is read in synchronization with read clock RCLK generated by SDRAM 1000.

The parallel data of 2 bits is held by data input/output circuit 1086, converted to serial data and sequentially output to data input/output terminal 1070 starting from a time t13.

Here, if the operation mode for burst reading has been set, in the reading operation at and subsequent to a time t14, the data of 2 bits is sequentially read in parallel, converted to serial data and output to the data input/output terminal while automatically incrementing the column address in SDRAM 1000.

At the time, signal QS is output from SDRAM 1000 in synchronization with the output of data, and a timing for outputting data is applied to an external portion of SDRAM 1000.

As described above, for the column related access, the address signal is received by column address latch 1050. There are two modes of changing the column address during bursting, that is, interleave and sequential modes, which will later be described. The selection of the changing mode is stored as an operation information in mode register 1046 in accordance with a combination of address signals. The changing mode of burst address counter 1060 changes under control of mode register 1046.

In the DDR-SDRAM operation mode, the data must be output twice in one cycle of the external clock signal. Then, as an operation of the internal circuit in the DDR-SDRAM operation mode, two data are read from the selected memory array block in one clock cycle. Therefore, the address signal output from burst address counter 1060 must simultaneously generate two addresses for reading two data.

In this case, generation of the burst address is not simply achieved by sequentially incrementing the input address as an initial state of the burst address, that is, the externally applied column address signal, may be an even or odd address.

Even when 1 is externally input as the column address signal, for example, a pair of internal column address signals which should be generated is (1, 2) and (1, 0) in the sequential and interleave modes, respectively.

Thus, a location where column selection for the even address is performed is different from that where column selection for the odd address (a column where a column selection signal is activated) pairing with the even address.

Therefore, SDRAM 1000 has a structure in which the memory cell array blocks are separated in regions corresponding to the even and odd addresses, and decoders for column selection signals corresponding to the even and odd addresses are separated for independent operation.

In a memory cell array bank0, for example, the memory array blocks are separated in regions 1100*a* and 1100*b* respectively corresponding to the even and odd addresses.

Structure of Internal Control Clock Generating Circuit 1008

Figure 4:
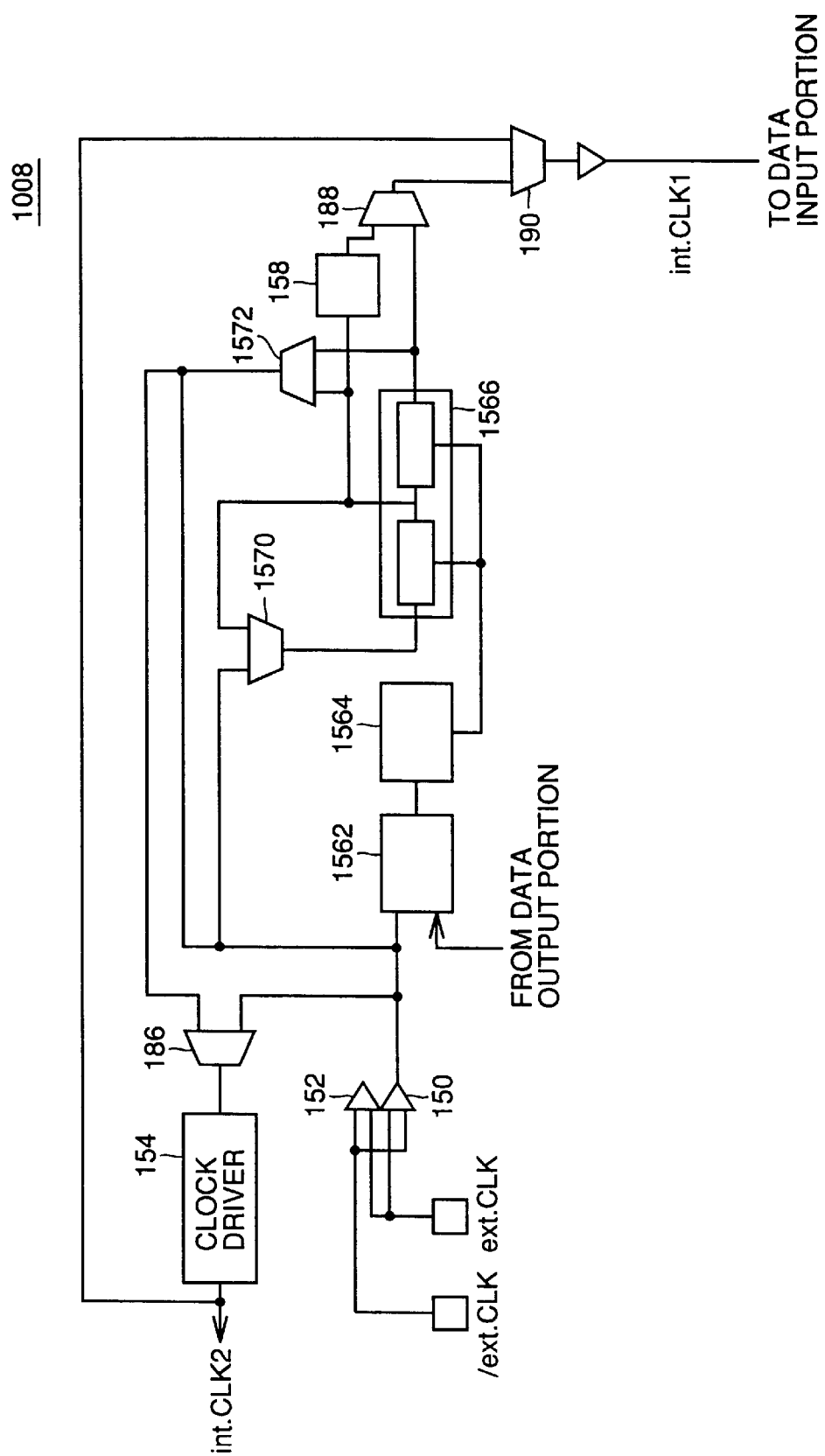
FIG. 4 is a schematic block diagram showing a structure of an internal control clock generating circuit 1008.

FIG. 4 is a schematic block diagram showing in further detail a structure of internal control clock generating circuit 1008.

Internal control clock generating circuit 1008 includes: a phase comparator 1562 receiving an output from a differential amplifier 150 and an internal clock signal int.CLK1 applied to a data output portion for comparing phases thereof; and a delay control circuit 1564 controlling a delay amount of a variable delay circuit 1566 in accordance with an output from phase comparator 1562.

Here, variable delay circuit 1566 includes delay circuits in a plurality of stages connected in series and each having a delay time which is controlled by a delay control signal from delay control circuit 1564.

Internal control clock generating circuit 1008 further includes: a multiplexer 1570 applying an output from differential amplifier 150 to variable delay circuit 1566 when internal control clock generating circuit 1008 operates as a DLL circuit and applying an output signal from a delay circuit which is positioned in the middle of the delay circuits in a plurality of stages included in variable delay circuit 1566 as an input to variable delay circuit 1566 when a synchronization circuit 156 operates as a PLL circuit; and a multiplexer 1572 applying an output from variable delay circuit 1566 to a switching circuit 186 when internal control clock generating circuit 1008 operates as the DLL circuit and applying an output from the delay circuit which is positioned in the middle of the plurality of delay circuits included in variable delay circuit 1566 to switching circuit 186.

A dividing circuit 158 shown in FIG. 4 receives the output from the middle delay circuit of the plurality of delay circuits included in variable delay circuit 1566 for outputting a signal whose frequency is divided in a prescribed dividing ratio.

A switching circuit 188 receives outputs from dividing circuit 158 and variable delay circuit 1566 for selectively outputting one of the outputs.

A switching circuit 190 receives outputs from a clock driver 154 and switching circuit 188 for selectively outputting one of the outputs as internal clock signal int.CLK1.

Switching circuit 186 receives outputs from differential amplifier 150 and multiplexer 1572 for selectively applying one of the outputs to clock driver 154. Internal clock signal int.CLK2 is used for controlling the internal circuit.

In an internal high speed mode, as a mode of the internal synchronization circuit is changed from a DLL operation mode to a PLL operation mode, the synchronization circuit is hereinafter referred to as a DPLL circuit.

Although a factor for integrally multiplying a frequency of the clock which is externally input in the internal high speed mode is not particularly limited, the frequency is for example multiplied by a factor of 4.

It is noted that in a mode in which internal control clock generating circuit 1008 operates as the DLL circuit, an output signal thereof, that is, int.CLK1, is used for example for controlling output of data. Here, a factor for integrally multiplying the frequency of the clock which is externally input in the internal high speed mode may be 8 to 16 or any number greater than that.

The operation will briefly be described.

An output from variable delay circuit 1566 is distributed to the internal circuit by clock driver 154. External clock signal ext.CLK which has been transmitted through a differential amplifying circuit (an input buffer) is selected by switching circuit 186, whose driving force is increased by clock driver 154, and distributed to the internal circuit system as a reference signal for a control signal.

An output from differential amplifier 150 is selected by multiplexer 1570 and input as a trigger signal for variable delay circuit 1566.

In a normal operation, the output from variable delay circuit 1566 is preferentially applied to the data output portion by switching circuits 188 and 190.

The clock signal which has been transmitted through switching circuit 190 and whose driving force has been increased by driver circuit 191 is distributed to each of input/output terminals DQ0 to DQ31.

The clock signal applied to each of input/output terminals DQ0 to DQ31 is input to phase comparator 1562. Phase comparator 1562 compares phases of internal clock signal int.CLK1 from a replica buffer and the external clock signal from differential amplifier 150.

Now, the operation in the internal high speed mode will be described.

For variable delay circuit 1566, an output from a delay circuit having a delay amount which is half a total delay amount of variable delay circuit 1566 is selected by multiplexer 1570 and applied to an input to variable delay circuit 1566 instead of the external clock signal. Thus, the variable delay circuit forms a closed loop.

Here, included in multiplexer 1570 is a circuit corresponding to one stage of inverter, which allows a delay stage included in a loop formed by the variable delay circuit and inverter circuit to be an odd stage. Thus, the loop forms a ring oscillator and starts self oscillation.

In the above described structure, the output is selected from a portion corresponding to half the total delay amount of variable delay circuit 1566 such that a delay amount of the ring oscillator corresponding to one period is equal to the delay amount of the variable delay circuit. An output from the ring oscillator is transmitted to a divider 158 where a frequency thereof is divided by four. Thereafter, it is selected by switching circuits 188 and 190 and distributed to each of input/output terminals DQ0 to DQ31. The delay amount of variable delay circuit 1566 is controlled by phase comparator 1562 and delay control circuit 1564 such that phase periods of internal clock signal int.CLK1 and the external clock signal match.

Thus, when the phases match, the frequency of the output from the ring oscillator is four times that of external clock signal ext.CLK.

Internal clock signal int.CLK2 having a frequency which is four times that of the external clock signal is selected by multiplexer 1572 and switching circuit 186, whose driving force is increased by clock driver 154 and distributed to be internal circuit system as a control signal.

The above described structure allows the internal circuit to automatically perform an operation corresponding to four bursts in a period of one clock of external clock signal ext.CLK, for example, in the reading operation.

In other words, in such operation mode, even when the frequency of external clock signal ext.CLK is not high, the internal circuit per se can operate at a high speed.

Structure of Data Input Portion

Figure 5:
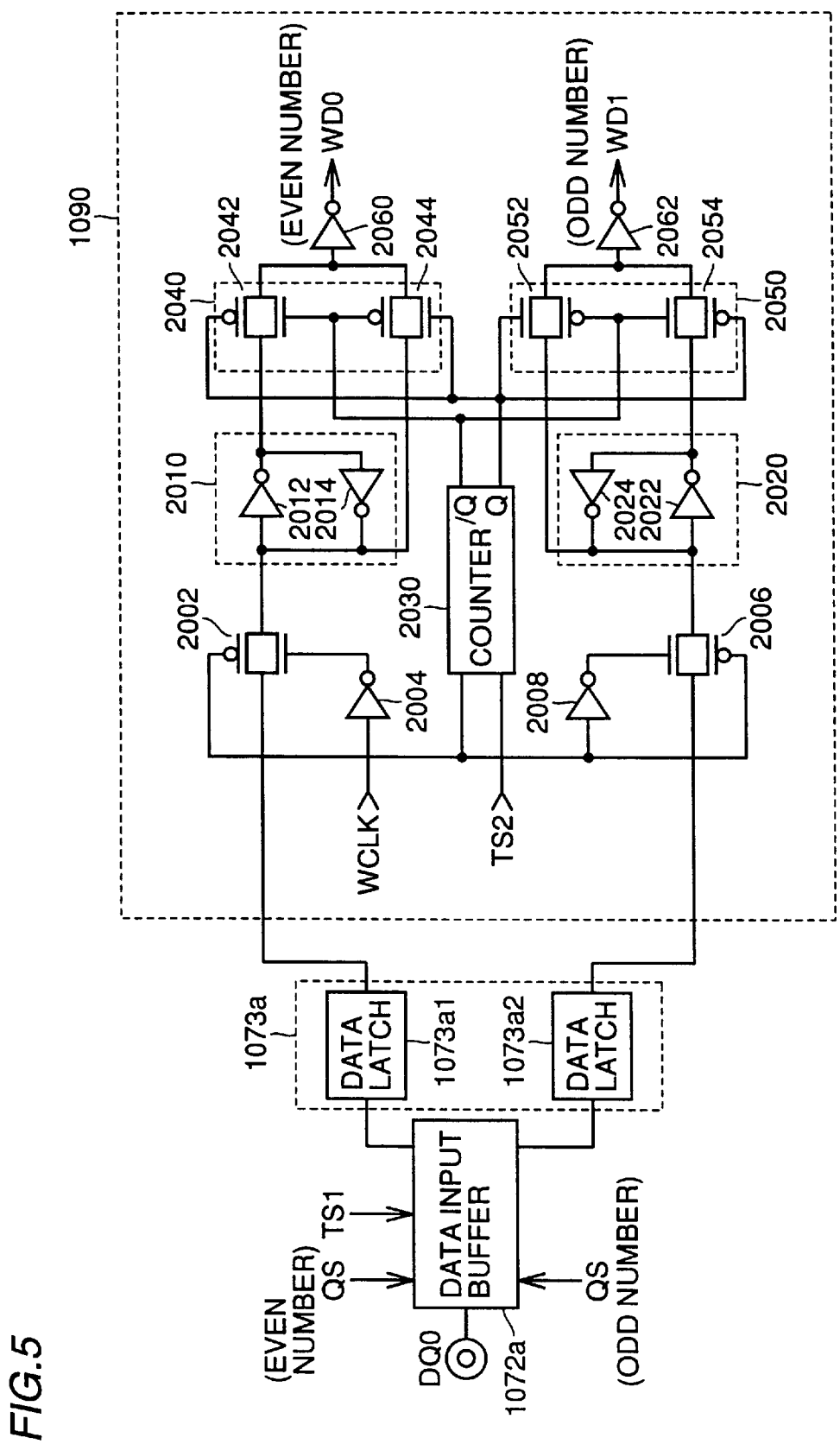
FIG. 5 is a schematic block diagram shown in conjunction with a structure of a write driver 1090.

FIG. 5 is a block diagram showing in further detail a structure of a data input portion shown in FIG. 2.

A data which is applied to data input/output terminal DQ0 is applied to latch circuit 1073a through data input buffer 1072a.

Latch circuit 1073a includes data latches 1073a1 and 1073a2 receiving data from data input buffer 1072a.

Data input buffer 1072a alternately applies data which are applied to data input/output terminal DQ0 in synchronization with data strobe signal QS to data latches 1073a1 and 1073a2 when signal TS1 is in an inactive state (in the normal operation).

The write data held by data latch 1073a1 is applied to a latch circuit 2010 through a transfer gate 2002 which is controlled by an output signal from inverter 2004 receiving and inverting write clock signal WCLK and signal WCLK.

On the other hand, the write data held by data latch circuit 1073a2 is applied to latch circuit 2020 through a transfer gate 2006 which is controlled by an output signal from inverter 2008 receiving and inverting signals WCLK. Latch circuit 2010 includes inverters 2012 and 2014 whose input and output nodes are mutually connected.

A counter 2030 is a 2-bit counter which is activated in response to activation ("H" level) of signal TS2 for performing a count operation in response to activation of write clock signal WCLK. In other words, an output signal Q from counter 2030 and an inverted signal /Q thereof are inverted in every cycle of write clock signal WCLK when signal TS2 is in the active state.

On the other hand, output signal Q from counter 2030 is maintained at the "L" level when signal TS2 is in the inactive state.

An output from latch circuit 2010 is applied to an inverter 2060 through a switching circuit 2040 and output as a write data WD0.

An output from latch circuit 2020 is applied to an inverter 2062 through a switching circuit 2050 and output as a write data WD1 from inverter 2062.

As will later be described, write data WD0 and WD1 are applied to even and odd address regions of the memory array, respectively.

Switching circuit 2040 includes: a transfer gate 2042 receiving an output from inverter 2012 and brought into a conductive state when output signal Q from counter 2030 is at the "L" level for applying the output to inverter 2060; and a transfer gate 2044 receiving an output from inverter 2014 and brought into the conductive state when signal Q is at the "H" level for applying the output to inverter 2062.

On the other hand, switching circuit 2050 includes: a transfer gate 2054 receiving an output from inverter 2022 and brought into the conductive state when output signal Q from counter 2030 is at the "L" level for applying the output to inverter 2062; and a transfer gate 2052 receiving an output from inverter 2024 and brought into the conductive state when signal Q is at the "H" level for applying the output to inverter 2062.

Figure 6:
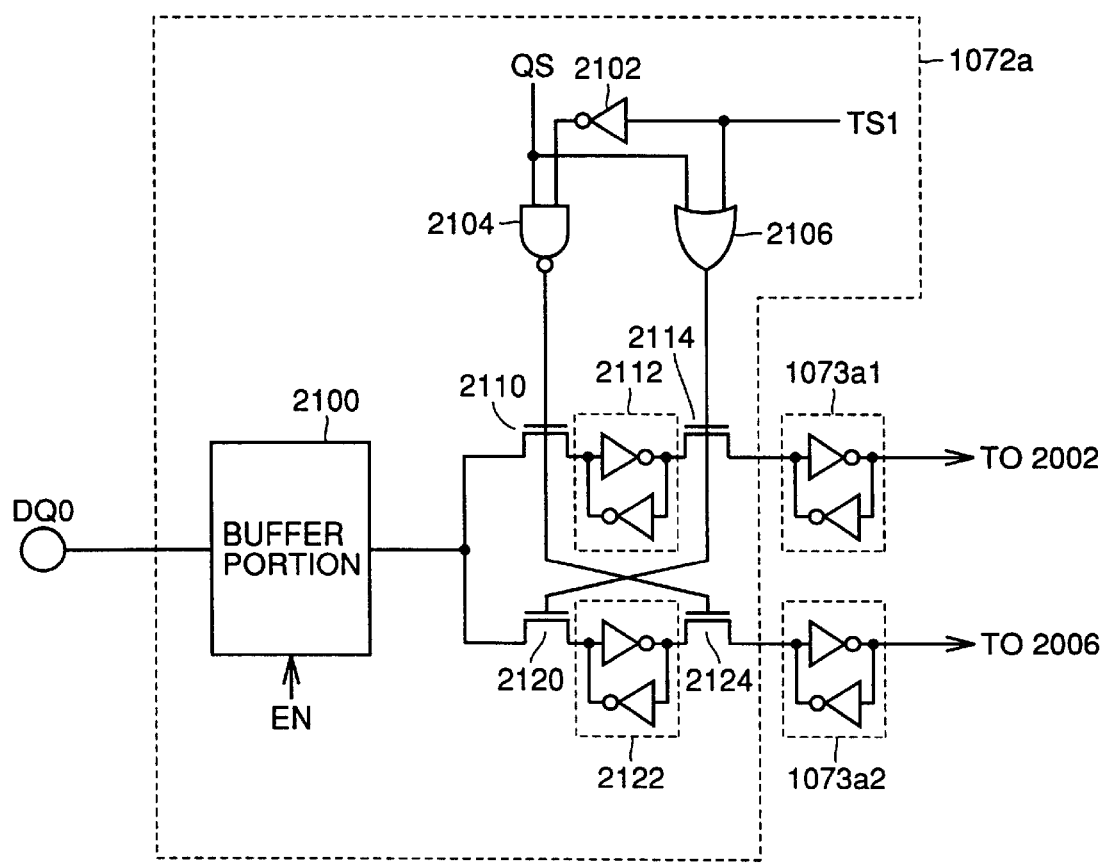

FIG. 6 is a schematic block diagram shown in conjunction with a structure of data input buffer 1072a shown in FIG. 5.

Data input buffer 1072a includes: a buffer portion 2100 activated in accordance with a signal EN and receiving a signal from data input/output terminal DQ0; an inverter 2120 receiving a signal DS1; an NAND circuit 2104 receiving an output from inverter 2102 and data strobe signal QS; an OR circuit 2106 receiving data strobe signal QS and signal TS1; an N channel MOS transistor 2110 having its gate potential controlled by an output from NAND circuit 2104; a latch circuit 2112 receiving a signal from buffer portion 2100 through N channel MOS transistor 2110; an N channel MOS transistor 2114 having its gate potential controlled by an output from OR circuit 2106 and connecting latch circuit 2112 and data latch 1073a; an N channel MOS transistor 2120 having its gate potential controlled by an output from OR circuit 2106; a latch circuit 2122 receiving an output signal from buffer portion 2100 through N channel MOS transistor 2120; and an N channel MOS transistor 2124 having its gate potential controlled by an output from NAND circuit 2104 and connecting latch circuit 2122 and data latch 1073b.

Figure 7:
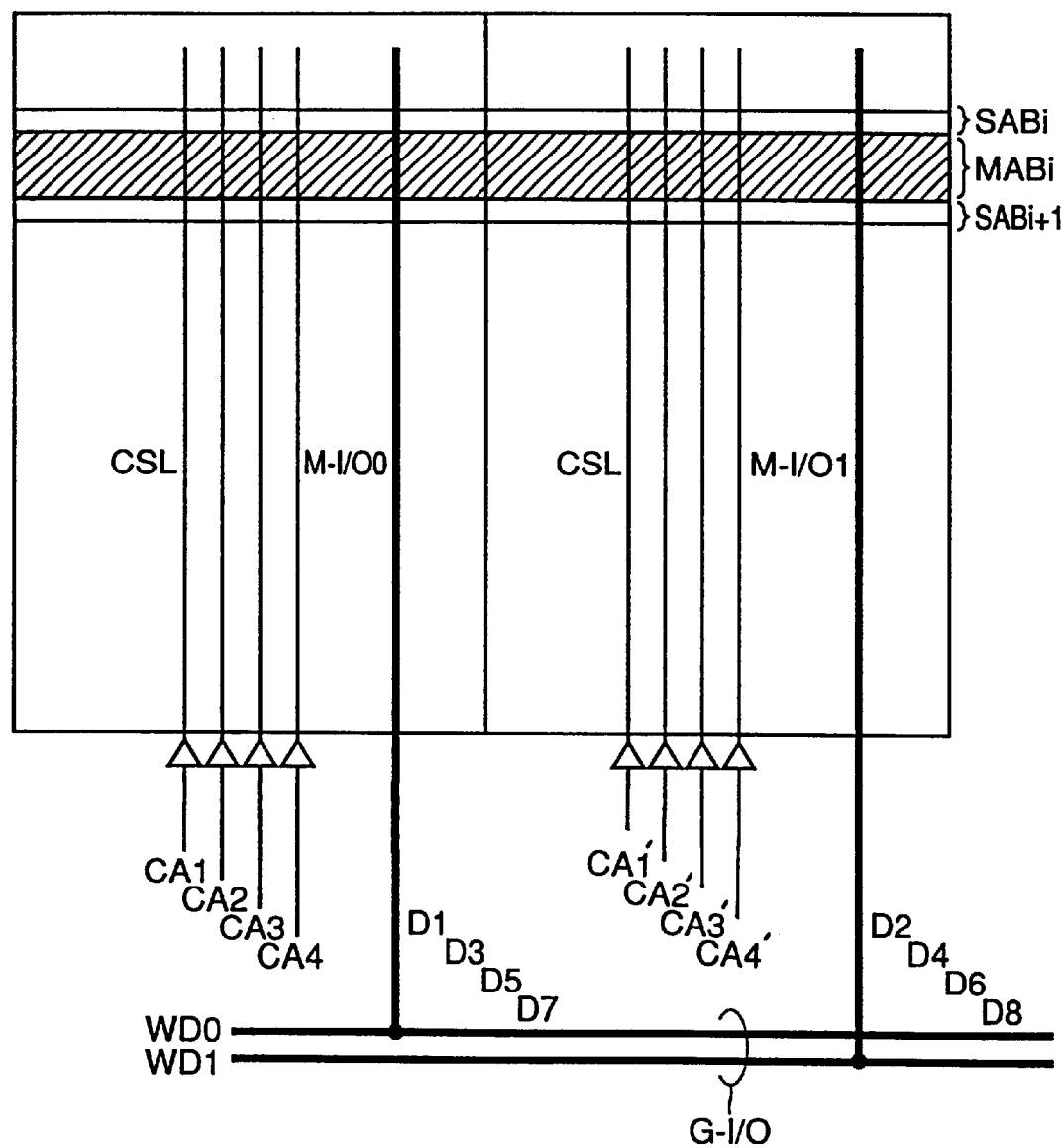
FIG. 7 is a schematic block diagram shown in conjunction with a structure of a memory array portion.

FIG. 7 is a schematic block diagram showing in further detail a structure of memory array block 1100 shown in FIG. 1.

Memory array block 1100 includes even and odd address regions 1100a and 1100b respectively corresponding to even and odd addresses.

Assume that the memory array block is divided into a plurality of memory array blocks MABi (i=1, . . . , N) in a row direction (in a direction of a word line).

Particularly, in FIG. 7, assume that i-th memory array block MABi is in a selection state in accordance with a row address signal. Amplifier bands SABi and SABi+1 are arranged on either side of memory array block MABi.

One column selection line CSL is activated in response to activation of one of internal column address signals CA1 to CA4 in even address region 1100a, and one column selection line CSL is also activated in response to activation of one of internal column address signals CA1' to CA4' in odd address region 1100b.

In the burst write operation, for example, internal column address signals CA1 to CA4 and CA1' to CA4' are sequentially generated in accordance with a count result from burst address counter 1060, and 2-bit data are written to even and odd address regions 1100a and 1100b at a time.

Write data WD0 and WD1 from global I/O bus G-I/O are transmitted to main I/O line pairs M-I/O0 and M-I/O1 respectively corresponding to even and odd address regions 1100a and 1100b.

In the above described burst write operation mode, for example, data D1, D3, D5 and D7 are sequentially applied to main I/O line pair M-I/O0 as write data WD0, and data D2, D4, D6 and D8 are sequentially applied to main I/O line pair M-I/O1 as write data WD1.

As described above, data are written by 2 bits in four cycles to each of even and odd address regions 1100a and 1100b for mutually adjacent memory cell columns, so that data of 8 bits in total are written.

Figure 8:
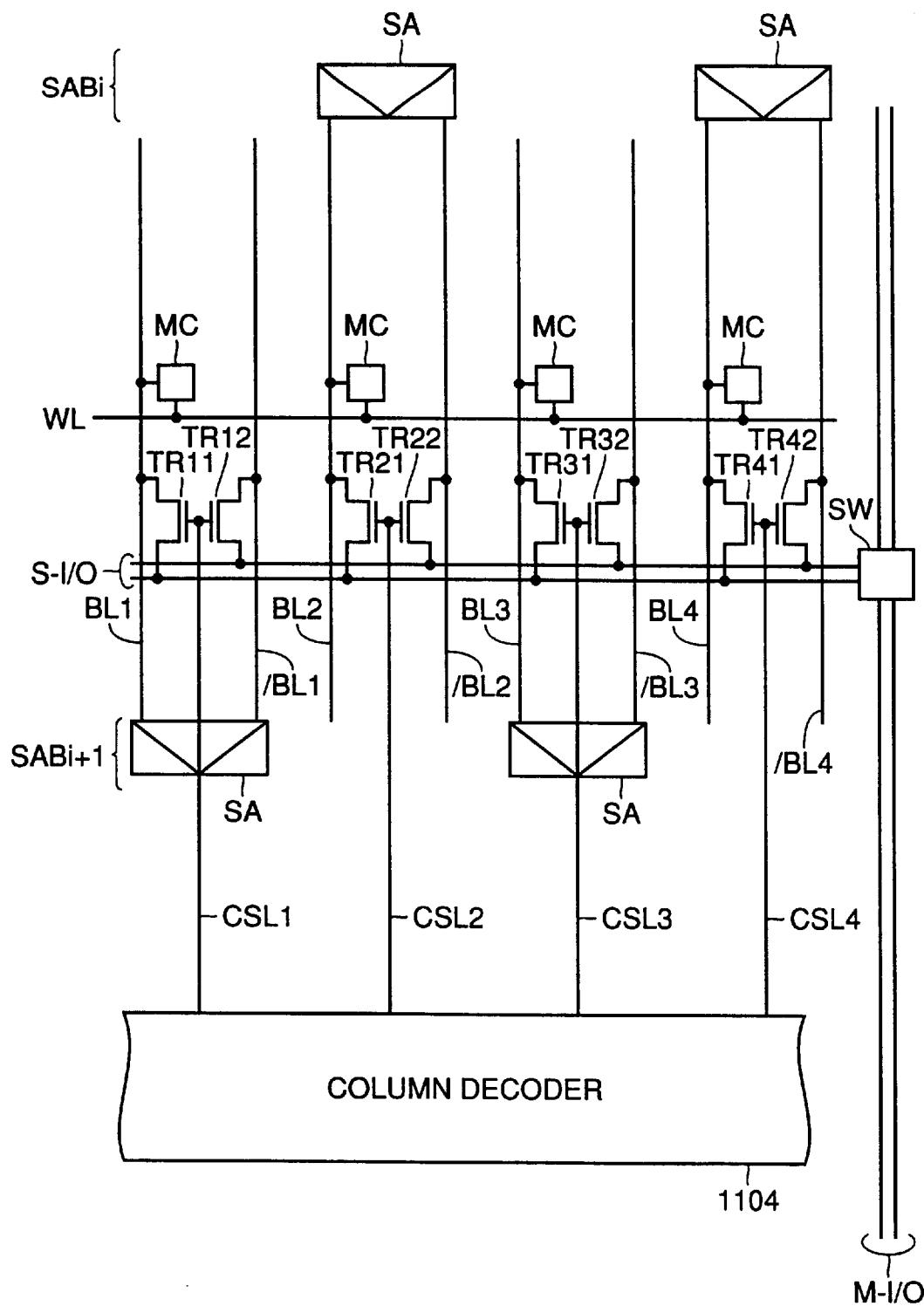
FIG. 8 is a schematic block diagram shown in conjunction with a structure of a memory array block MABi.

FIG. 8 is a schematic block diagram showing in further detail a structure of memory array block MABi shown in FIG. 7.

FIG. 8 shows an arrangement of bit line pairs BL1, /BL1, . . . , BL4, /BL4 corresponding to four memory cell columns of memory array block MABi.

Referring to FIG. 8, sense amplifiers provided for bit line pairs BL1, /BL1 and BL3, /BL3 belong to sense amplifier band SABi+1, whereas sense amplifiers SA provided for bit line pairs BL2, /BL2 and BL4, /BL4 belong to sense amplifier band SABi.

In other words, sense amplifiers SA corresponding to the adjacent bit line pairs are alternately provided in sense amplifier bands SABi and SABi+1 which are oppositely provided for memory array block MABi.

The write data transmitted by main I/O line pair M-I/O is transmitted to a sub I/O line pair S-I/O provided in the word line direction through a switching circuit SW. Bit line pair BL1, /BL1 and sub I/O line pair S-I/O are respectively connected through transistors TR11 and TR12, whereas bit line pair BL2, /BL2 and sub I/O line pair S-I/O are respectively connected through N channel MOS transistors TR21 and TR22.

Gate potentials of transistors TR11 and TR12 are controlled by column selection line CSL1 which is selectively activated by column decoder 1104. On the other hand, gates of transistors TR21 and TR22 are similarly controlled by column selection line CSL2 which is selectively activated by column decoder 1104.

Memory cells MC corresponding to selected word line WL are respectively connected to bit lines BL1 and BL2.

Similar structures are provided for bit line pairs BL3, /BL3 and BL4, /BL4.

Column selection lines CSL1 to CSL4 are selectively activated in accordance with column addresses CA1 to CA4, respectively.

Figure 9:
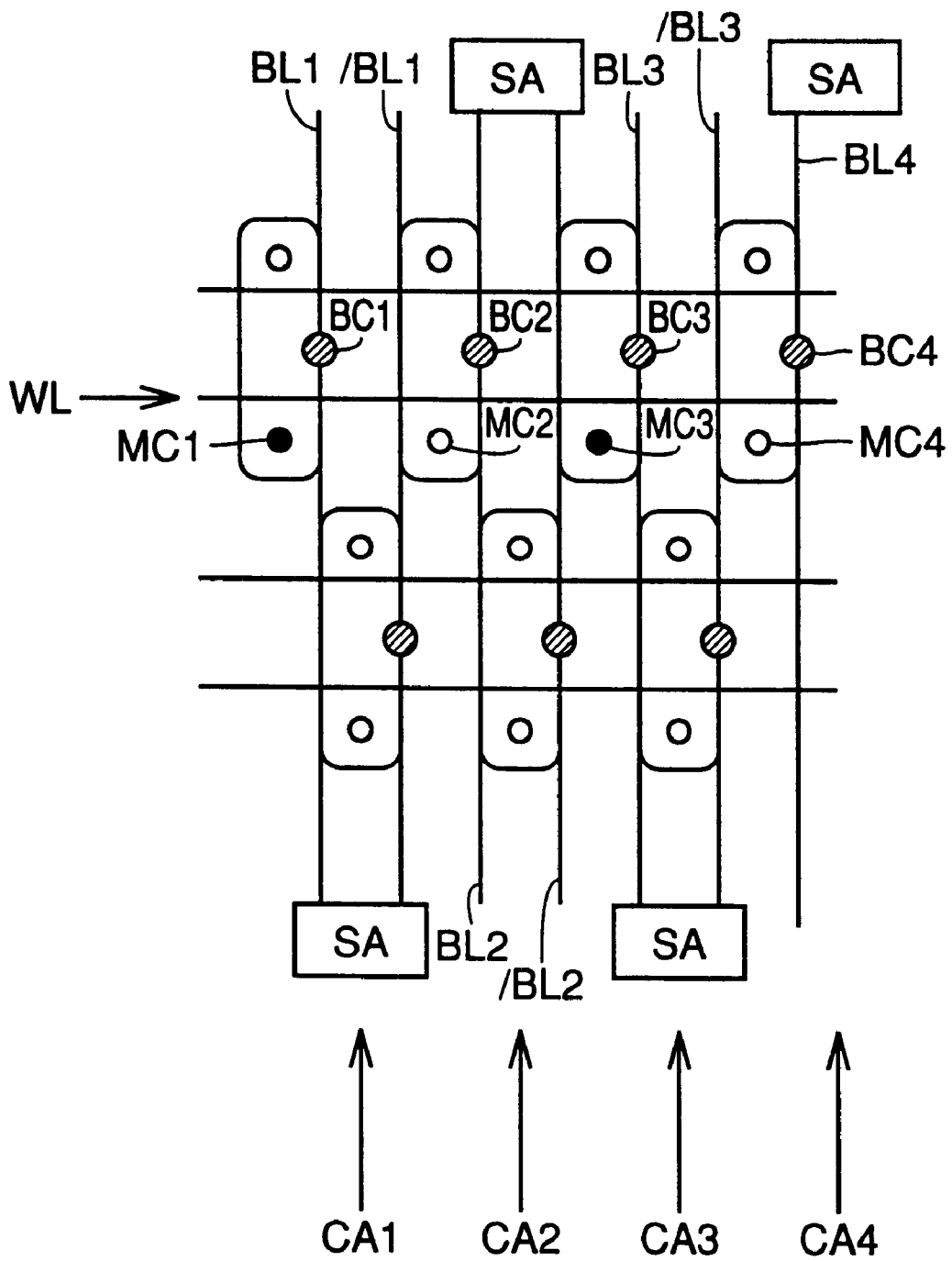
FIG. 9 is a plan view shown in conjunction with a data writing pattern in a test operation mode.

FIG. 9 is a plan view showing an arrangement of write data when data is written to the memory cell shown in FIG. 8.

In FIG. 9, assume that counter 2030 in the driver circuit which has been described in conjunction with FIG. 5 is activated in accordance with signal TS2 and write data is inverted for every cycle of write clock signal WCLK.

More specifically, referring to FIG. 9, in the first cycle in writing cycles, bit line pair BL1, /BL1 is selected in accordance with column address signal CA1, and a data at the "H" is written to memory cell MC1 which is controlled by selected word line WL through a bit line contact BC1 for connecting bit line BL1 and memory cell MC1.

Thereafter, in the second cycle of the writing cycle, bit line pair BL2, /BL2 is selected in accordance with address signal CA2, and a data at the "L" level is written to a memory cell MC2 which is activated by selected word line WL through a bit line contact BC2 connecting bit line BL2 and memory cell MC2.

In other words, although the data held by latch circuit 1273a are all at the "H" level in the period in which data writing is performed for bit line pairs BL1, /BL1 and BL2, /BL2, when an output level of counter circuit 2030 is inverted, data at the inverted level (at the "L" level) is written to memory cell MC2.

Similarly, in the third cycle of the writing operation, data at the "H" level is written to a memory cell MC3 which is connected to bit line pair BL3, /BL3 selected in accordance with column address signal CA3 and, in the fourth cycle, data at the "L" level is written to a memory cell MC4 connected to bit line pair BL4, /BL4.

As described above, when test mode signal TS2 is activated, mutually inverted data are written to memory cells which are adjacent to each other in the row direction. Thus, when a test of measuring a refresh characteristic of the memory cell is performed, a voltage stress can be applied between the memory cells for testing.

In other words, by reading the data which has been written as shown in FIG. 9 after a prescribed period of time is elapsed, it is possible to determine if there is any defect caused by a leakage current between the memory cells.

Figure 10:
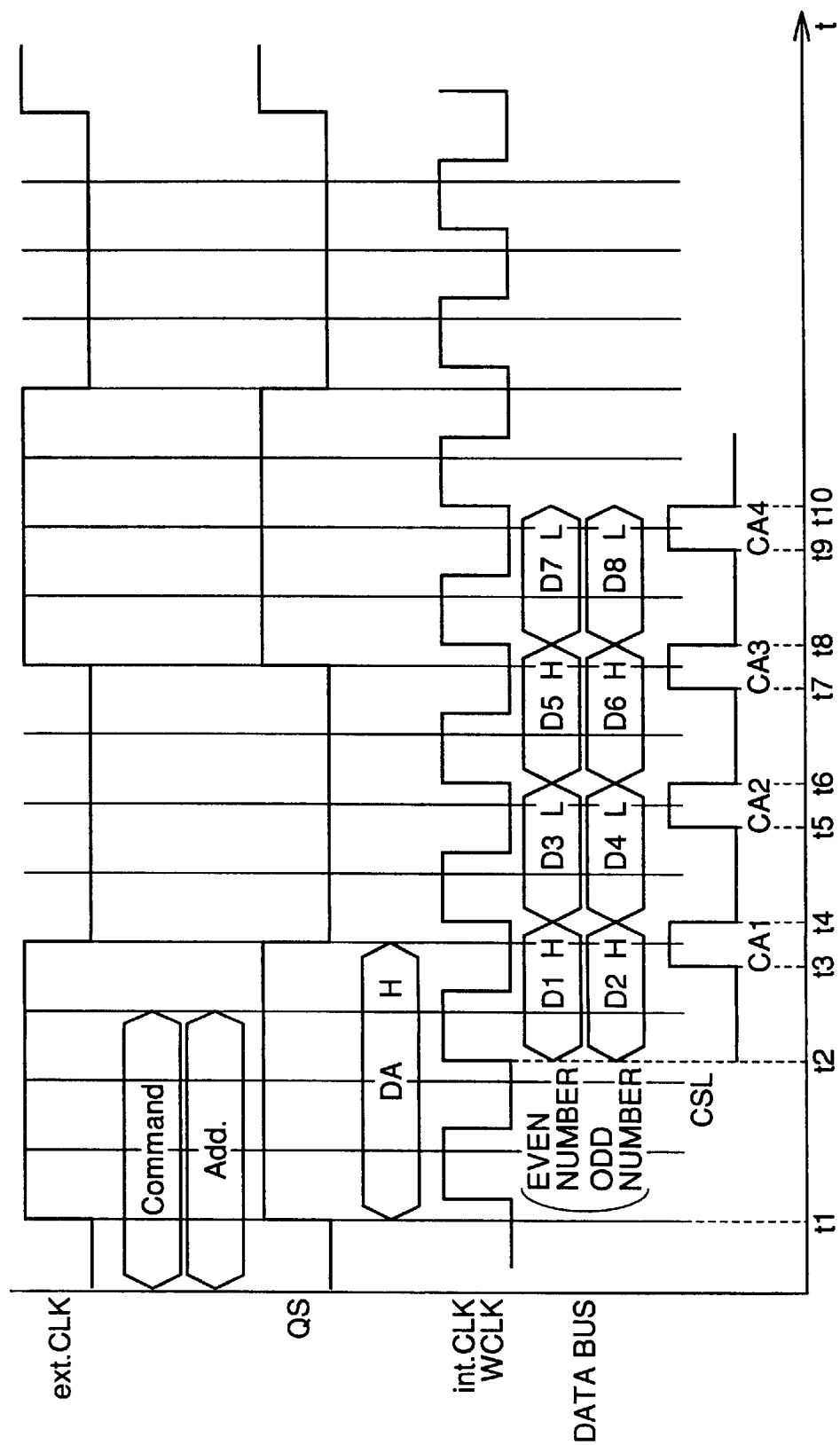
FIG. 10 is a timing chart shown in conjunction with SDRAM 1000 according to the first embodiment.

FIG. 10 is a timing chart shown in conjunction with a test operation in the above described test operation mode when test signals TS1 and TS2 are both in the active state (at the "H" level).

Assume that the writing operation mode has been designated and the row address signal has been applied before time t1 shown in FIG. 10.

At the rising edge of external clock signal ext.CLK at time t1, command and column address signals are applied.

At t1, data strobe signal QS for applying a timing for externally writing data to SDRAM 1000 is also brought into the active state and, responsively, data DA applied to the data input/output terminal attains, for example, to the "H" level.

Responsively, data at the "H" level are simultaneously written to data latches 1073a1 and 1073a2 in latch circuit 1073a.

Successively, write clock signal WCLK begins to be output from internal control clock generating circuit 1008 when a prescribed period of time is elapsed after the rising edge of external clock signal ext.CLK at t1.

As shown in FIG. 10, in the test operation mode, write clock signal WCLK is generated having a frequency which is four times (thus having a period which is one fourth) that of external clock signal ext.CLK.

In response to the rising edge of write clock signal WCLK at time t2, write data WD0 and WD1 are output from driver circuit 1090 and transmitted onto the global I/O bus as data D1 and D2.

At time t3, column selection line CSL1 corresponding to column address signal CA1 is brought into the active state, and data D1 and D2 at the "H" level are respectively written to the selected memory cell columns in even and odd address regions 1100a and 1100b.

At time t4, column selection line CSL1 is brought into the inactive state, and data at the "L" level are output to global I/O line pair G-I/O from driver circuit 1090.

The data are transmitted to even and odd address regions 1100a and 1100b as write data D3 and D4, respectively. At time t5, in response to the fact that column selection line CSL2 corresponding to column address signal CA2 is brought into the active state, data D3 and D4 at the "L" level are written to the memory cells in the selected memory cell columns.

Subsequently, in a next cycle of write clock WCLK, data D5 and D6 at the "H" level are similarly written. Further, write data D7 and D8 at the "L" level are respectively written to the selected memory cells in even and odd address regions 1100a and 1100b in the next cycle of write clock WCLK.

Figure 11:
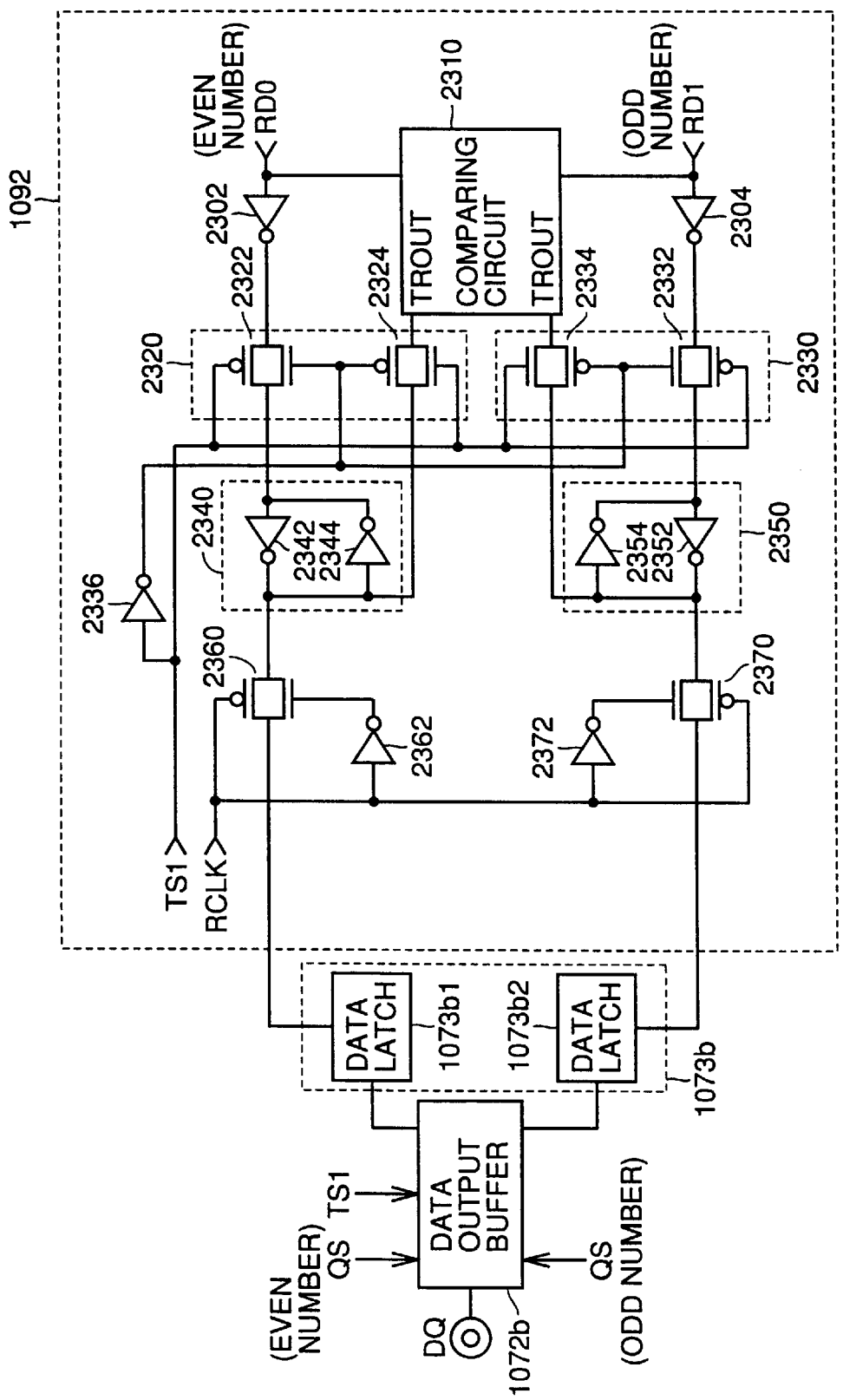
FIG. 11 is a schematic block diagram shown in conjunction with a structure of a read driver circuit 1092.
Figure 12:
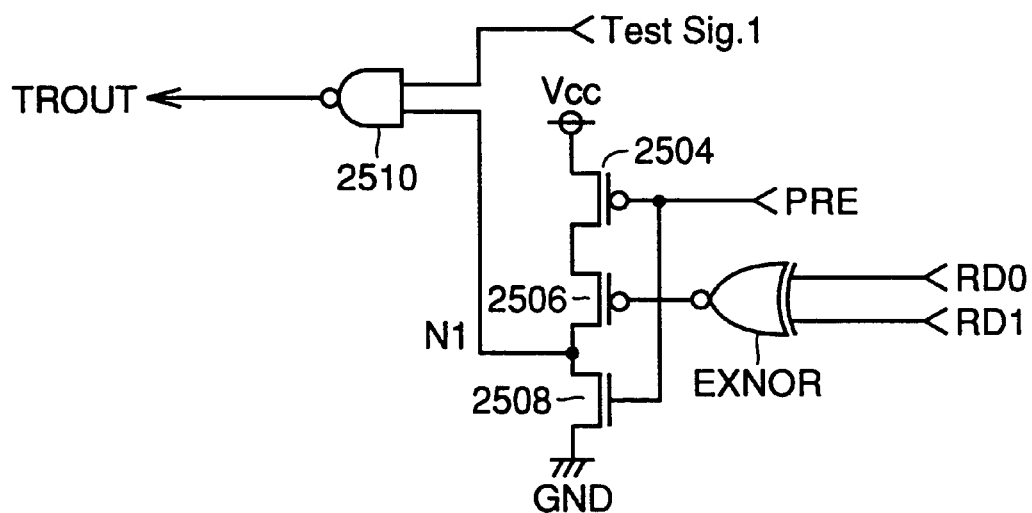
FIG. 12 is a schematic block diagram shown in conjunction with a structure of a comparing circuit 2310.

FIG. 11 is a schematic block diagram showing a structure of a read driver circuit 1092 shown in FIG. 2.

Referring to FIG. 11, read driver circuit 1092 includes: an inverter 2302 receiving a read data RD0 from even address region 1100a; an inverter 2304 receiving a read data RD1 from odd address region 1100b; a comparing circuit 2310 receiving read data RD0 and RD1 and outputting a comparison result thereof as a signal TROUT; a switching circuit 2320 receiving an output from inverter 2302 and signal TROUT; and a switching circuit receiving an output from inverter 2304 and signal TROUT.

Switching circuit 2320 includes: a transfer gate 2322 receiving an output from inverter 2302, controlled by an output from an inverter 2336 outputting signal TS1 and an inverted signal of signal TS1 and brought into the conductive state when signal TS1 is at the "L" level; a transfer gate 2324 controlled by signal TS1 and the inverted signal thereof, receiving signal TROUT and brought into the conductive state when signal TS1 is at the "H" level.

Switching circuit 2330 includes: a transfer gate 2332 controlled by signal TS1 and the inverted signal thereof, receiving an output from inverter 2304 and brought into the conductive state when signal TS1 is at the "L" level; and a transfer gate 2334 controlled by signal TS1 and the inverted signal thereof and brought into the conductive state when signal TS1 is at the "H" level.

Driver circuit 1092 further includes a latch circuit 2340 receiving outputs from transfer gates 2322 and 2324, and a latch circuit 2350 receiving outputs from transfer gates 2332 and 2334.

Latch circuit 2340 includes an inverter 2342 receiving the output from transfer gate 2322, and an inverter 2344 connected to form a latch circuit with inverter 2342 and having its input node receiving the output from transfer gate 2324.

Latch circuit 2350 includes an inverter 2352 receiving the output from transfer gate 2332, and an inverter 2354 connected to form a latch circuit with inverter 2352 and having its input node receiving the output from transfer gate 2334.

Driver circuit 1092 further includes: an inverter 2362 receiving a read clock signal RCLK; a transfer gate 2360 controlled by signal RCLK and an inverted signal thereof, receiving an output from latch circuit 2344 and brought into the conductive state when the read clock signal is at the "L" level; and a transfer gate 2370 controlled by an inverter 2372 outputting signal RCLK and the inverted signal thereof, receiving an output from latch circuit 2350 and brought into the conductive state when signal RCLK is at the "L" level.

An output from transfer gate 2360 is held by a data latch 1073b1 in latch circuit 1073b, and an output from transfer gate 2370 is held by a data latch 1073b2 in latch circuit 1073b.

Data output buffer 1073b receives outputs from data latches 1073b1 and 1073b2 for alternately outputting empty data to data latches 1073b1 and 1073b2 when signal TS1 is at the "L" level (in the normal operation) and outputting one of outputs from data latches 1073b1 and 1073b2 to data input/output terminal DQ0 when signal TS1 is in the active state (at the "H" level).

Comparing circuit 2310 includes an exclusive NOR operating circuit EXNOR receiving read data RD0 and RD1; and P channel MOS transistors 2504 and 2506 and an N channel MOS transistor 2508 connected in series between a power supply potential Vcc and a ground potential 2508.

P and N channel MOS transistors 2504 and 2508 have their gates receiving precharge signals PRE, and P channel MOS transistor 2506 has its gate receiving an output from a logic gate NEXOR.

A connection node for P and N channel MOS transistors 2506 and 2508 is hereinafter referred to as a node N1.

Comparing circuit 2310 further includes an NAND circuit 2510 receiving signal TS1 and a potential level of node N1 as an input for outputting signal TROUT.

Now, an operation of comparing circuit 2310 will be described.

Before data is read by the burst operation in the test operation mode when signal TS1 is at the "H" level, precharge signal PRE temporarily attains to the "H" level, so that N channel MOS transistor 2508 is brought into the conductive state and the level of node N1 is at the "L" level.

After such initial setting operation is performed, if read data RD0 and RD1 are the same, an output from exclusive NOR operating circuit EXNOR attains to the "H" level, so that P channel MOS transistor 2500 is kept in the non-conductive state.

Thus, output signal TROUT from NAND circuit 2510 is maintained at the "H" level. At the time, a signal at the "H" level is output to data input/output terminal DQ0, and it is shown that data read from the even and odd regions match.

However, when at least one pair of read data RD0 and RD1 of successively read data have different values, the output from gate circuit EXNOR attains to the "L" level, and P channel MOS transistor 2506 is brought into the conductive state. Responsively, the level of node N1 is charged to the "H" level.

When the potential level of node N1 attains to the "H" level, output signal TROUT attains to the "L" level. The level which is output to data input/output terminal DQ0 is maintained at the "L" level until the precharge signal is activated.

More specifically, the above described operation allows a symbolic data indicating a test result of burst data which are successively read to be output to a specific data input/output pint DQ0 and, when at least one pair of data from even and odd address regions do not match in the reading operation mode, a fail signal at the "L" level is output to corresponding data input/output pin DQ0.

As described above, the timing for outputting data is in synchronization with the external clock (which has a low frequency).

Thus, in the test operation mode, as the internal circuit operates at a speed which is higher than that of the external clock signal and data which are inverted between the adjacent memory cells are internally generated and written, the burden on the tester can be reduced.

Second Embodiment

In the first embodiment, when there is at least one pair of read data which do not match of a series of data which are burst read, the signal at the "L" level indicating that a mismatch state has been detected is output to the data input/output terminal.

With only such structure, however, although it is possible to find that there is a defective bit during a series of burst reading operations, an address of the defective bit cannot be determined.

In a synchronous semiconductor memory device according to a second embodiment, for example, comparing circuits 2310 as shown in FIG. 11 are provided corresponding to a plurality of data input/output terminals DQ0 to DQ3. In addition, a defective bit address monitor circuit 3000 is provided which generates a determination result in accordance with the plurality of comparing circuits 2310. In this respect, the synchronous semiconductor memory device according to the second embodiment is different from SDRAM 1000 according to the first embodiment.

Other parts of the synchronous semiconductor memory device are similar to those of the structure of SDRAM 1000 according to the first embodiment, and therefore a structure of defective bit address monitor circuit 3000 will be mainly described in the following.

It is noted that in the following description, although the case where read data are output to data input/output terminals DQ0 to DQ3 is exemplified to simplify the description, the present invention is not limited to such case and can also be applied to the case where data are output to a smaller or larger number of data input/output terminals.

A structure of comparing circuit 2310 is similar to that shown in FIG. 11.

In the following, the comparing circuits corresponding to data input/output terminals DQ0 to DQ3 are denoted by reference numerals 2310.0 to 2310.3 to allow distinction thereamong.

Defective bit address monitor circuit 3000 receives test results TROUT0 to TROUT3 respectively output from comparing circuits 2310.0 to 2310.3 and counts a cycle number of read clock signal RCLK in the period in which data is output as long as signals TROUT0 to TROUT3 are all normal (that is, at the "H" level). If one of signals TROUT0 to TROUT3 shows a determination result of defective bit, defective bit address monitor circuit 3000 stops the count operation of signal RCLK. The count result from defective bit address monitor circuit 3000 is output to data input/output terminals DQM0 and DQM1 for a write data mask signal which is not used during the test operation.

In other words, for data input/output buffers 3100 and 3102 for input pins DQM0 and DQM1 for the write data mask signal, the test mode is not designated as in the case of the second embodiment and, in the period in which signal TS3 from mode decoder 1022 is in the inactive state (that is, at the "L" level), data from input/output terminals DQM0 and DQM1 are received. On the other hand, when signal TS3 is in the active state (at the "H" level), output signals Ad1 and Ad2 from defective bit address monitor circuit 3000 are received and output to input/output terminals DQM0 and DQM1.

Figure 13:
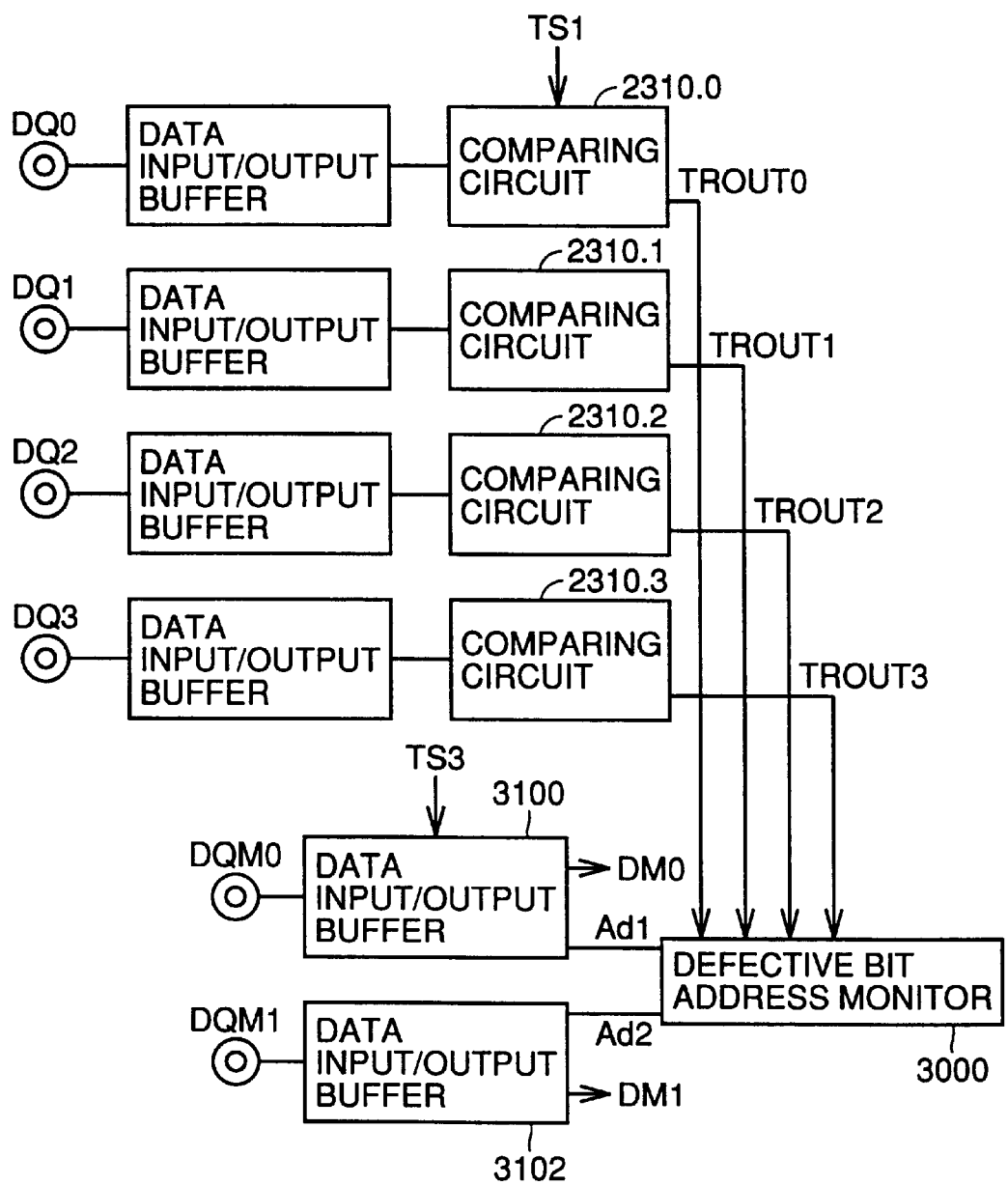
FIG. 13 is a schematic block diagram shown in conjunction with a defective bit address monitor circuit 3000 according to a second embodiment of the present invention.
Figure 14:
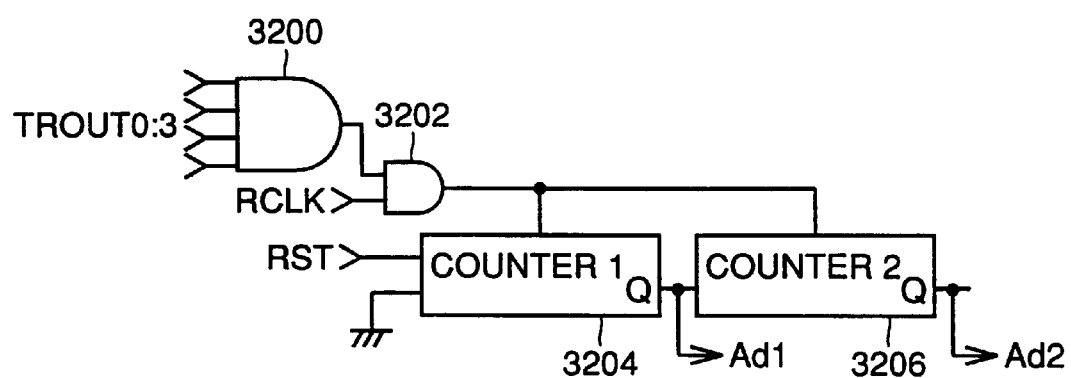
FIG. 14 is a schematic block diagram shown in conjunction with a structure of defective bit address monitor circuit 3000.

FIG. 14 is a schematic block diagram showing a structure of defective bit address monitor circuit 3000 shown in FIG. 13.

Defective bit address monitor circuit 3000 includes: an AND circuit 3200 receiving signals TROUT0 to TROUT3; an AND circuit 3200 receiving an output from AND circuit 3200 and read clock signal RCLK; and first and second 2-bit counters 3204 and 3206 which are reset in accordance with reset signal RST and perform the count operation in accordance with the output from AND circuit 3202.

An output from first 2-bit counter 3204 is output as signal Ad1, and an output from second counter 3206 which receives the output from first 2-bit counter 3204 for count operation is output as signal Ad2.

It is noted that as is apparent from the above description, when the number of data which are read in the burst operation is large, in other words, when the burst length is greater, a similar operation can be achieved by increasing the number of 2-bit counters.

The above described structure allows the count operation of counters 3204 and 3206 to stop when the result of defective bit is obtained in the burst reading operation, so that the count result when the count operation is stopped is externally output from input/output terminals DQM0 and DQM1.

Output levels of DQM0 and DQM1 are determined on the side of the tester, so that the address of the defective bit is determined during the burst reading operation.

In the above description, a rapid access is achieved by synchronous semiconductor memory device 1000 in the double data rate operation during normal operation. In the double data rate operation, data reading and writing operations are performed both at the rising and falling edges of the external clock signal. The present invention is not limited to this and can be applied to a so-called RAMBUS type DRAM, that is, a memory having a rate of data reading/writing for the external clock signal which is equal to or higher than the double data rate. In other words, also in the RAMBUS type DRAM, the internal clock in synchronization with the external clock is generated by the internal synchronization signal generating circuit. Therefore, as in the case of the above description, in test operation mode, if the internal synchronization signal generating circuit generates the internal clock signal having a frequency which is higher than that of the external clock signal, a test operation similar to those of the first and second embodiments can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal and a control signal in synchronization with an external clock signal, comprising:

a memory cell array having a plurality of memory cells arranged in a matrix;

an internal synchronization signal generating circuit outputting a first internal clock signal in synchronization with said external clock signal in response to designation of a first operation mode and outputting a second internal clock signal in synchronization with said external clock signal and having a frequency higher than that of said external clock signal in response to designation of a second operation mode;

an address signal input circuit receiving said address signal in synchronization with said external clock signal;

an address counter circuit generating internal address signals corresponding to the adjacent memory cells in accordance with said address signal in time series for a prescribed number of cycles of an output from said internal synchronization signal generating circuit;

a memory cell selecting circuit operating in accordance with the output from said internal synchronization signal generating circuit for selecting said memory cell in accordance with said internal address signal; and a data writing circuit outputting a write data to the memory cell selected by said memory cell selecting circuit and including an internal data generating circuit generating an internal write data sequentially inverted based on a prescribed write data in synchronization with said second internal clock signal in said second operation mode, and a driving circuit outputting the output from said internal data generating circuit to the memory cell sequentially selected by said memory cell selecting circuit in said second operation mode.

2. The synchronous semiconductor memory device according to claim 1, wherein said memory cell array includes:

a first address region corresponding to an odd address; and a second address region corresponding to an even address, said memory cell selecting circuit selecting at least one memory cell column for every cycle simultaneously in each of said first and second address regions in accordance with said internal address signal.

3. The synchronous semiconductor memory device according to claim 2, wherein said data writing circuit further includes a data input circuit operating in synchronization with said external clock signal holding at least two serially applied write data and converting them to parallel data in said first operation mode and holding said applied prescribed write data in said second operation mode, and said driving circuit applies the parallel data output from said data input circuit to the memory cell columns selected in said first and second address regions, respectively.

4. The synchronous semiconductor memory device according to claim 1, further comprising a comparing circuit sequentially reading data written to said first and second address regions by said data writing circuit as a pair of data and outputting a comparison result of said pair of data in said second operation mode.

5. A synchronous semiconductor memory device according to claim 1, further comprising a data reading circuit reading data from the memory cells selected by said memory cell selecting circuit, said data reading circuit including
a first data transportation path transmitting said data from the selected memory cells in said first operation mode,
a comparing circuit comparing the data sequentially read with an expected value in said second operation mode,
a second data transmission path transmitting said data from said comparing circuit in said second operation mode, and
a switch circuit selectively outputting, according to which of said first and second operation mode is designated, data transmitted through said first and second data transmission paths to the outside of said synchronous semiconductor memory device.

6. A synchronous semiconductor memory device receiving an address signal and a control signal in synchronization with an external clock signal, comprising:
a memory cell array having a plurality of memory cells arranged in a matrix;
an internal synchronization signal generating circuit outputting a first internal clock signal in synchronization with said external clock signal in response to designation of a first operation mode and outputting a second internal clock signal in synchronization with said external clock signal and having a frequency higher than that of said external clock signal in response to designation of a second operation mode;
an address signal input circuit receiving said address signal in synchronization with said external clock signal;
an address counter circuit sequentially generating internal address signals by a number corresponding to a burst length in accordance with said address signal in each cycle of an output from said internal synchronization signal generating circuit;
a memory cell selecting circuit operating in accordance with the output from said internal synchronization signal generating circuit for selecting said memory cell in accordance with said internal address signal; and
a data reading circuit reading a data from the memory cell selected by said memory cell selected circuit and including a comprising circuit comparing the data sequentially read corresponding to said burst length and an expected value in said second operation mode, and a count circuit counting a value of said internal address until said comparing circuit outputs a comparion result of mismatch.

7. The synchronous semiconductor memory device according to claim 6, wherein said address counter circuit sequentially generates an internal address signal corresponding to an adjacent memory cell in time series in accordance with said address signal in every cycle of the output from said internal synchronization signal generating circuit, said synchronous semiconductor memory device further comprises a data writing circuit outputting a write data to the memory cell selected by said memory cell selecting circuit, and said data writing circuit further includes:
an internal data generating circuit sequentially generating an internal write data to be inverted in synchronization with said second internal clock signal in accordance with a prescribed write data in said second operation mode; and
a driving circuit sequentially outputting the output from said internal data generating circuit to the memory cell selected by said memory cell selecting circuit in said second operation mode.

8. The synchronous semiconductor memory device according to claim 6, wherein said memory cell array includes
a first address region corresponding to an odd address, and
a second address region corresponding to an even address,
said memory cell selecting circuit selecting at least one memory cell column for every cycle simultaneously in each of said first and second address regions in accordance with said internal address signal.

9. The synchronous semiconductor memory device according to claim 8, wherein said writing circuit further includes a data input circuit operating in synchronization with said external clock signal for holding at least two write data serially applied and converting the write data to parallel data in said first operation mode and holding said applied prescribed write data in said second operation mode,
said driving circuit applies the parallel data output from said data input circuit to the memory cell columns selected in said first and second address regions in said first operation mode, and
said comparing circuit sets one of read data from said first and second address regions as said expected value and compares said expected value with the read data from the other of said first and second address regions.

10. The synchronous semiconductor memory device according to claim 9, wherein said comparing circuit includes:
an exclusive NOR gate receiving the read data from one of said first and second address regions and the read data from the other of said first and second address regions;
an internal node;
a precharging circuit for precharging said internal node in accordance with a precharge signal and an output from said exclusive NOR gate; and
a gate circuit receiving a potential of said internal node and an operation mode designation signal designating said second operation mode for outputting a comparison result signal.

11. The synchronous semiconductor memory device according to claim 7, wherein said memory cell array is divided into a plurality of memory cell blocks, each of said memory cell blocks including a first address region corresponding to an odd address and a second address region corresponding to an even address, and
said memory cell selecting circuit selects at least one memory cell column for every cycle in each of said first and second address regions of said each memory cell block simultaneously in accordance with said internal address signal.

12. The synchronous semiconductor memory device according to claim 11, wherein said comparing circuit includes a plurality of internal comparing circuits corresponding to said plurality of memory cell blocks, each of said internal comparing circuits sets a read data from one of said first and second address regions of corresponding memory cell block as said expected value and compares said expected value with a read data from the other of said first and second address regions in said second operation mode, and said count circuit counts a value of said internal address until said internal comparing circuit outputs a comparison result of mismatch.

13. A synchronous semiconductor memory device receiving an address signal and a control signal in synchronization with an external clock signal, comprising:

a memory cell array having a plurality of memory cells arranged in a matrix;

an internal synchronization signal generating circuit outputting a first internal clock signal in synchronization with said external clock signal in response to designation of a first operation mode and outputting a second internal clock signal in synchronization with said external clock signal and having a frequency higher than that of said external clock signal in response to designation of a second operation mode;

an address signal input circuit receiving said address signal in synchronization with said external clock signal;

an address counter circuit generating internal address signals based on said address signal in time series for a prescribed number of cycles of an output from said internal synchronization signal generating circuit;

a memory cell selecting circuit operating in accordance with the output from said internal synchronization signal generating circuit for sequentially selecting said memory cells corresponding to said internal address signals; and a data reading circuit reading data from the memory cells selected by said memory cell selecting circuit, said data reading circuit including a first data transmission path transmitting said data from the selected memory cells in said first operation mode, a comparing circuit comparing the data sequentially read with an expected value in said second operation mode, a second data transmission path transmitting said data from said comparing circuit in said second operation mode, and a switch circuit selectively outputting, according to which of said first and second operation mode designated, data transmitted through said first and second data transmission paths to the outside of said synchronous semiconductor memory device.

* * * * *